United States Patent
Takamura et al.

(10) Patent No.: US 9,982,334 B2
(45) Date of Patent: May 29, 2018

(54) POLYCRYSTALLINE SILICON SPUTTERING TARGET

(71) Applicant: JX Nippon Mining & Metals Corporation, Tokyo (JP)

(72) Inventors: Hiroshi Takamura, Ibaraki (JP); Ryo Suzuki, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 841 days.

(21) Appl. No.: 14/375,154

(22) PCT Filed: Jan. 31, 2013

(86) PCT No.: PCT/JP2013/052125
§ 371 (c)(1),
(2) Date: Jul. 29, 2014

(87) PCT Pub. No.: WO2013/115289
PCT Pub. Date: Aug. 8, 2013

(65) Prior Publication Data
US 2015/0001069 A1    Jan. 1, 2015

(30) Foreign Application Priority Data

Feb. 1, 2012 (JP) ................................ 2012-019753

(51) Int. Cl.
*C23C 14/34* (2006.01)
*C01B 33/02* (2006.01)
(Continued)

(52) U.S. Cl.
CPC .......... *C23C 14/3414* (2013.01); *C01B 33/02* (2013.01); *C23C 14/16* (2013.01); *H01J 37/3426* (2013.01); *H01J 2237/339* (2013.01)

(58) Field of Classification Search
CPC ... C23C 14/3414; C01B 33/02; H01J 37/3426
See application file for complete search history.

(56) References Cited

U.S. PATENT DOCUMENTS 3,051,555 A * 8/1962 Rummel ................. C01B 33/02
                                                         117/217
5,454,424 A   10/1995 Mori et al.
(Continued)

FOREIGN PATENT DOCUMENTS

CN      102126726 A    7/2011
JP      H05-229812 A   9/1993
(Continued)

OTHER PUBLICATIONS

Translation to Hanazawa (JP 07-315827) published Dec. 1995. (Year: 1995).*

*Primary Examiner* — John J Brayton
(74) *Attorney, Agent, or Firm* — Howson & Howson LLP

(57) ABSTRACT

Provided is a polycrystalline silicon target produced by a melting method. In the polycrystalline silicon sputtering target, the average amount of nitride or carbide grains having a size of 100 μm or more for samples of 100×100 mm taken from an arbitrary plane of the target is less than three. Also provided is a method of producing a polycrystalline silicon sputtering target. The method is characterized in that a silicon ingot is produced by melting silicon as a raw material with an electron beam and pouring the molten silicon into a crucible heated at 90° C. or more, and the resulting ingot is machined into a target. The present invention has focused on polycrystalline silicon produced by a melting method, and an object of the present invention is to provide a polycrystalline silicon sputtering target having high quality by reducing the presence of silicon nitride and silicon carbide and to provide a polycrystalline silicon sputtering target having a high bending strength by devising the production process.

11 Claims, 1 Drawing Sheet

(51) Int. Cl.
*H01J 37/34* (2006.01)
*C23C 14/16* (2006.01)

(56) References Cited

U.S. PATENT DOCUMENTS

| | | |
|---|---|---|
| 8,236,428 B2 | 8/2012 | Satoh et al. |
| 8,252,422 B2 | 8/2012 | Takamura et al. |
| 8,512,868 B2 | 8/2013 | Suzuki et al. |
| 8,647,747 B2 | 2/2014 | Takamura et al. |
| 8,659,022 B2 | 2/2014 | Suzuki et al. |
| 9,103,048 B2 | 8/2015 | Weinert et al. |
| 2010/0016144 A1 | 1/2010 | Suzuki et al. |
| 2010/0127221 A1 | 5/2010 | Weinert et al. |
| 2010/0167111 A1* | 7/2010 | Sumihara ............... H01M 4/72 429/94 |
| 2010/0187661 A1 | 7/2010 | Suzuki et al. |
| 2010/0330325 A1 | 12/2010 | Suzuki et al. |
| 2011/0114480 A1* | 5/2011 | Yamazaki .......... C23C 14/3407 204/298.13 |
| 2013/0341622 A1 | 12/2013 | Takamura et al. |

FOREIGN PATENT DOCUMENTS

| | | | |
|---|---|---|---|
| JP | 07315827 A | * 12/1995 | ........... C01B 33/037 |
| JP | H07-315827 A | 12/1995 | |
| JP | H11-240710 A | 9/1999 | |
| JP | 2003-286565 A | 10/2003 | |
| JP | 2004-161575 A | 6/2004 | |
| JP | 2005-112662 A | 4/2005 | |
| WO | WO 99/19102 | * 4/1999 | |
| WO | 2004/085312 A1 | 10/2004 | |
| WO | 20101024310 A1 | 3/2010 | |

* cited by examiner

[Fig. 1]
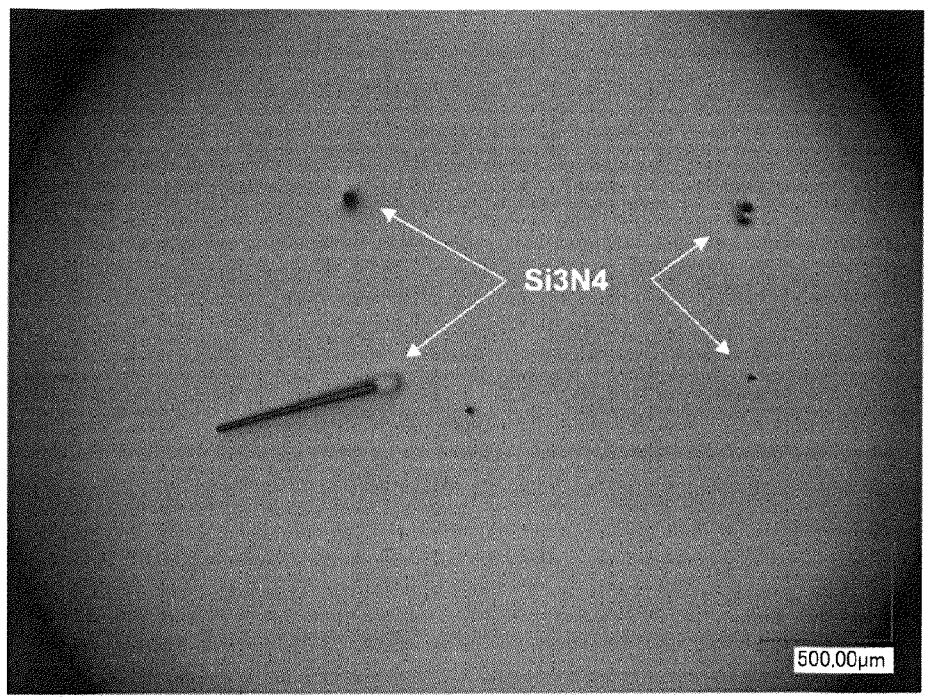
[Fig. 2]
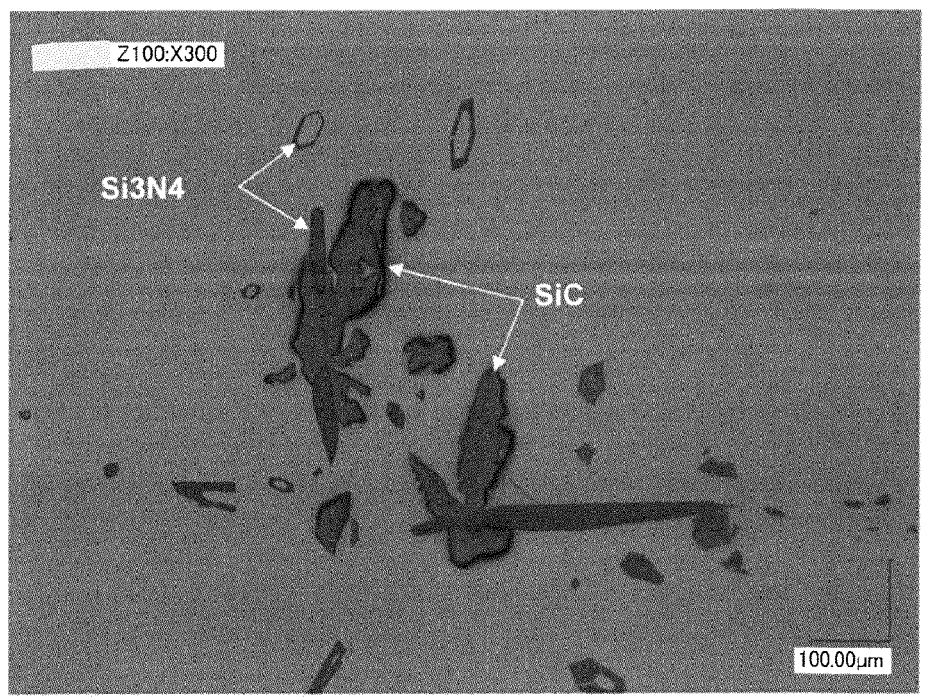

POLYCRYSTALLINE SILICON SPUTTERING TARGET

BACKGROUND

The present invention relates to a polycrystalline silicon sputtering target produced by a melting method.

Accompanied by progress in miniaturization and improvement of the precision of LSI, sputtering targets as raw materials for forming thin films have been increasingly demanded to have higher purity and higher stability (reduction in frequency of occurrence of arcing and particles) during sputtering.

Also in sputtering target of silicon (Si), similarly, it is demanded to reduce not only the amount of metal impurities, which adversely affect LSI, but also the amounts of compounds composed of silicon and gas components, such as silicon oxide, silicon nitride, and silicon carbide, which cause occurrence of arcing and particles during sputtering.

Hitherto, the Si materials that are used for Si sputtering targets and the production methods can be classified into three types. One of them is a monocrystalline ingot that is produced by a Czochralski method (CZ method) or a floating zone method (FZ method), and the ingot is used by cutting to about a target thickness.

The second is a polycrystalline silicon block produced through a sintering process by producing a fine silicon powder and sintering the powder by, for example, hot-pressing under high temperature and high pressure conditions (see Patent Documents 1 and 2).

The third is a polycrystalline silicon ingot produced through a melting method, which is a usual method of producing polycrystalline silicon for solar cells, by melting silicon once in a crucible and allowing growth in unidirectional solidification.

Selection from these three types of Si materials is performed depending on the size and price of a sputtering target and the purpose of a thin film to be formed.

In the case of monocrystalline silicon, about 300 mm is the maximum diameter of generally available ingots for producing silicon wafers having a diameter of 300 mm, which is the current majority, and there is a restriction in production of a sputtering target having a diameter larger than this.

Although prototype ingots having a diameter of 450 mm have been recently produced towards a shift to 450 mm wafers, the state is that there are still problems in price and supply thereof.

The sputtering target corresponding to a 300 mm silicon wafer usually needs a diameter of 420 mm or more, and it is believed that a 450 mm wafer needs a target having a diameter of about 600 mm. Thus, monocrystalline silicon, even if it has a high purity (11N) or an excellent sputtering property, has a basic problem of incapable of corresponding to large diameter products.

On the other hand, in polycrystalline silicon produced through a sintering process, raw materials are required to be formed into fine powders once, and the powder surfaces are progressively oxidized in the process. Even if deoxidization is performed (see Patent Documents 1 and 2), the amount of oxygen is large compared to the amount thereof in cases of monocrystals or the silicon material for the melting method, and the polycrystalline silicon produced through a sintering process has a problem of readily causing occurrence of arcing during sputtering.

In addition, since the polycrystalline silicon produced through a sintering process is contaminated with impurities in the pulverization step, it is difficult to obtain high purity compared to silicon in other methods, and the purity, excluding gas components (C, N, and O), is about 5N to 6N.

However, the sintered silicon has a higher bending strength than that of other Si materials and is therefore hardly broken even if bending stress occurs during sputtering. Since the size of crystal grains is significantly smaller than that of silicon produced through a melting method, a homogeneous thin film can be advantageously formed.

A polycrystalline silicon ingot produced through a melting method has a demerit that the crystal grains coarsen, resulting in a decrease in bending strength. However, the polycrystalline silicon ingot is produced for use in solar cells and is actually widely used in large-sized products of 840 mm square or more. The polycrystalline silicon ingot can satisfy a purity (excluding gas components) of 6N to 7N, which is high for polycrystalline silicon, and has a merit of being relatively inexpensively available.

From these backgrounds, in Si targets having a diameter of 420 mm or more corresponding to a 300 mm wafer, which is the current majority, polycrystalline silicon produced through a melting method is widely used.

However, it has been revealed that a sputtering target produced from a polycrystalline silicon ingot prepared by melting silicon in a conventional silica crucible and unidirectionally solidifying the silicon from the bottom of the crucible cannot obtain sufficient characteristics for recent new uses of Si thin films.

The reason thereof is as follows. Silicon nitride ($Si_3N_4$) is applied to the inner wall of a silica crucible before subjecting silicon to melting in order to prevent silicon from reacting during melting and burning during solidification. However, the silicon nitride becomes mixed into the molten silicon or precipitates during a step of cooling the silicon after being once subject to melting. As a result, as shown in FIG. 1, acicular or annular silicon nitride is generated in the silicon structure, and it is likely that the presence of such silicon nitride causes occurrence of arcing or particles during sputtering.

For the use in solar cells, the presence of foreign substances composed of such silicon nitride ($Si_3N_4$) does not affect the conversion efficiency of sunlight and, therefore, does not conventionally cause a problem. However, it was revealed that in sputtering targets, the presence of the contaminant described above causes a major problem.

If the carbon concentration in a silicon material before being melted is high, silicon carbide is produced when silicon is subject to melting. As a result, petaloid silicon carbide is generated in the silicon structure as shown in FIG. 2, and it has been revealed that the presence of silicon carbide similarly causes occurrence of particles. In FIG. 2, acicular or annular silicon nitride ($Si_3N_4$) is also observed.

Thus, even if a polycrystalline silicon sputtering target is produced by a melting method, which has an advantage in manufacturing cost, the target has some problems, and the problems are desired to be solved.

Patent Document 1: JP H05-229812 A
Patent Document 2: JP 2004-289065 A

SUMMARY

The present invention has been made in consideration of the above and has focused on polycrystalline silicon produced by a melting method, and an object of the present invention is to provide a polycrystalline silicon sputtering target with high quality by reducing the presence of silicon nitride and silicon carbide and to provide a polycrystalline silicon sputtering target having high bending strength by devising the production process.

In order to solve the above-mentioned problems, the present inventors have performed verification by repeating a manufacturing test of polycrystalline silicon and as a result, have found that a large-sized polycrystalline silicon target containing less impurities and having excellent mechanical properties can be obtained.

On the basis of the above-described findings, the present invention provides:

1. A polycrystalline silicon sputtering target produced by a melting method, wherein the average amount of nitride or carbide grains having a size of 100 μm or more for samples of 100×100 mm taken from an arbitrary plane of the target is less than three;

2. The polycrystalline silicon sputtering target according to 1 above, wherein the average amount of nitride or carbide grains having a size of 20 μm or more for samples of 100×100 mm is less than three;

3. The polycrystalline silicon sputtering target according to 1 or 2 above, having a purity, excluding gas components, of 6N or more; and 4. The polycrystalline silicon sputtering target according to any one of 1 to 3 above, having a bending strength of 100 MPa or more.

On the basis of the above-described findings, the present invention provides:

5. A method of producing a polycrystalline silicon sputtering target, comprising:
   producing a silicon ingot by melting silicon as a raw material with an electron beam and pouring the molten silicon into a crucible heated at 90° C. or more; and
   machining the resulting ingot into a target;

6. The method of producing a polycrystalline silicon sputtering target according to 5 above, wherein a copper or copper alloy crucible or a molybdenum crucible is used;

7. The method of producing a silicon target according to 5 or 6 above, wherein a medium used for heating the crucible is water, oil, indium, or tin;

8. The method of producing a polycrystalline silicon sputtering target according to any one of 5 to 7 above, wherein the average amount of nitride or carbide grains having a size of 100 μm or more for samples of 100×100 mm is less than three in an arbitrary plane of the target;

9. The method of producing a polycrystalline silicon sputtering target according to 8 above, wherein the average amount of nitride or carbide grains having a size of 20 μm or more for samples of 100×100 mm is less than three;

10. The method of producing a polycrystalline silicon sputtering target according to any one of 5 to 9 above, wherein the target has a purity, excluding gas components, of 6N or more;

11. The method of producing a polycrystalline silicon sputtering target according to any one of 5 to 10 above, wherein the target has a bending strength of 50 MPa or more; and 12. The method of producing a polycrystalline silicon sputtering target according to any one of 5 to 10 above, wherein the target has a bending strength of 100 MPa or more.

A polycrystalline silicon sputtering target of the present invention that is produced by a melting method can have high quality achieved by reducing the presence of silicon nitride and silicon carbide, and enables to reduce occurrence of arcing and particles during sputtering and to form a silicon film with good quality. In addition, the present invention has an excellent effect of capable of preparing a polycrystalline silicon sputtering target having a high bending strength by devising the production process.

BRIEF DESCRIPTION OF DRAWINGS

FIG. 1 This is a diagram showing the presence of acicular or annular ($Si_3N_4$) in a polycrystalline silicon sputtering target produced using a conventional silica crucible to which silicon nitride is applied for preventing burning.

FIG. 2 This is a diagram showing the presence of petaloid silicon carbide in the target when the silicon raw material before being melted has a high carbon concentration.

DETAILED DESCRIPTION

In the production of a polycrystalline silicon sputtering target of the present invention, silicon as a raw material is subject to melting with an electron beam. The molten silicon is poured into a crucible heated at 90° C. or more to produce a silicon ingot. Subsequently, the ingot is machined into a sputtering target of polycrystalline silicon.

In a conventional technology, electron beam melting is performed for refining the silicon, and the molten silicon is poured into a water-cooled copper crucible, which causes cracking. In the use for solar cells, the ingot is pulverized into nugget-like shapes and is poured into a crucible for unidirectional solidification. Accordingly, it is advantageous in some aspects that the silicon irradiated with an electron beam is fragile. Due to such background, there is no concept to directly use the silicon poured into a crucible as a target material.

The melting of silicon, as a raw material, with an electron beam can remove volatile materials (impurity elements) and can further increase the purity. Although it is necessary to use a silicon raw material having a low carbon (C) content, the electron beam melting can further reduce the carbon content together with remaining oxygen.

The molten silicon is poured into a crucible heated at 90° C. or more for absorbing thermal shock. As a result, cracking in the silicon ingot can be prevented, breaking of the target due to the cracking of the ingot can be prevented, and the bending strength can be increased. Consequently, a target having a bending strength of 50 MPa or more, further 100 MPa or more, can be achieved.

This effect cannot be obtained if the temperature of the crucible is lower than 90° C. There is no upper limit on the temperature of the heated crucible before silicon is poured therein, but in order to prevent softening of the crucible and occurrence of chemical reaction due to an excessively increased crucible temperature induced by the heat capacity of the molten silicon poured into the crucible, the upper limit is preferably 350° C.

Thus, since the strength of the polycrystalline silicon sputtering target can be increased, the present invention has characteristics of significantly increasing the yield and reducing the manufacturing cost.

As the crucible, a copper or copper alloy crucible or a molybdenum crucible can be used. These metals have high thermal conductivity and therefore can maintain the entire crucible at a uniform temperature and also can efficiently control the temperature to a predetermined temperature when the molten silicon is poured into the crucible. Furthermore, the metals have sufficiently high melting points and do not actively react with silicon. Thus, the metals can advantageously allow the crucible to be heated and maintained at a higher temperature compared to conventional crucibles.

As the medium for heating the crucible to 90° C. or more, at least one material selected from water, oil, indium, and tin can be used. The heating medium can heat a crucible by being circulated in a channel (fluid passage) formed inside the thickness of the crucible.

The method of producing a target described above is a process for mainly increasing the bending strength of the target and is also characterized by using a copper or copper alloy crucible or a molybdenum crucible.

Since a conventional silica crucible having an inner wall to which silicon nitride ($Si_3N_4$) is applied for preventing reaction with silicon during melting and burning during solidification is not used, acicular or annular foreign substances (silicon nitride) as shown in FIG. 1 does not occur. In addition, there is an effect of decreasing petaloid silicon carbide by eliminating the conditions of incorporating carbon as much as possible.

That is, it is possible to reduce the average amount of nitride or carbide grains having a size of 100 μm or more for samples of 100×100 mm taken from an arbitrary plane of the produced target to less than three. Furthermore, it is also possible to reduce the average amount of nitride or carbide grains having a size of 20 μm or more for samples of 100×100 mm to less than three.

Furthermore, the present invention can provide a polycrystalline silicon sputtering target having a purity, excluding gas components, of 6N or more. Therefore, occurrence of arcing and particles during sputtering can be inhibited and a film with high quality can be formed.

EXAMPLES

The present invention will now be described based on the Examples. The following Examples are intended to make understanding of the present invention easier, and the present invention is not limited to these Examples. That is, other examples and modifications based on the technical idea of the present invention are encompassed in the present invention as a matter of course. In addition, for comparison, Comparative Examples are also shown.

Example 1

A silicon raw material having a purity, excluding gas components, of 6N was subject to electron beam melting. The resulting silicon melt was poured into a copper crucible maintained at a constant temperature by circulating hot water of 70° C. to be solidified into a polycrystalline silicon ingot. The ingot was cut into a block of 100×100×50 mm, and the block was sliced into a thickness of 1 mm with a multi-blade saw to produce samples of 100×100×1 mm.

A silicon target heated during sputtering may cause a warp due to a difference in thermal expansion between the target and the backing plate, and is therefore required to have a certain strength. Accordingly, the thus-produced 30 sample pieces were subject to a four-point bending test to measure the average bending strength. As a result, in the case of solidifying silicon in a crucible of 70° C., the average bending strength was 50 MPa.

In addition, the presence of petaloid silicon carbide or acicular or annular silicon nitride ($Si_3N_4$) as shown in FIG. 2 was not observed.

Example 2

Silicon melt produced as in Example 1 was poured into a copper crucible maintained at a constant temperature by circulating silicon oil of 120° C. to be solidified into a polycrystalline silicon ingot. The ingot was cut into a block of 100×100×50 mm as in Example 1, and the block was sliced into a thickness of 1 mm with a multi-blade saw to produce samples of 100×100×1 mm.

The thus-produced 30 sample pieces were subject to a four-point bending test to measure the average bending strength. As a result, in the case of solidifying silicon in a crucible of 120° C., the average bending strength was 70 MPa. In addition, the presence of petaloid silicon carbide or acicular or annular silicon nitride ($Si_3N_4$) as shown in FIG. 2 was not observed.

Example 3

Silicon melt produced as in Example 1 was poured into a copper crucible maintained at a constant temperature by circulating silicon oil of 200° C. to be solidified into a polycrystalline silicon ingot. The ingot was cut into a block of 100×100×50 mm as in Example 1, and the block was sliced into a thickness of 1 mm with a multi-blade saw to produce samples of 100×100×1 mm.

The thus-produced 30 sample pieces were subject to a four-point bending test to measure the average bending strength. As a result, in the case of solidifying silicon in a crucible of 200° C., the average bending strength was 105 MPa.

It was demonstrated that the silicon solidified in the crucible of 200° C. had a sufficient strength to be used as a sputtering target. In addition, the presence of petaloid silicon carbide or acicular or annular silicon nitride ($Si_3N_4$) as shown in FIG. 2 was not observed.

Comparative Example 1

A silicon raw material having a purity, excluding gas components, of 6N was subject to electron beam melting. The resulting silicon melt was poured into a conventional water-cooled (about 10° C.) copper crucible to be solidified into a polycrystalline silicon ingot. The ingot was cut into a block of 100×100×50 mm as in Example 1, and the block was sliced into a thickness of 1 mm with a multi-blade saw to produce samples of 100×100×1 mm.

The thus-produced 30 sample pieces were subject to a four-point bending test to measure the average bending strength. As a result, in the case of solidifying silicon in a water-cooled copper crucible, the average bending strength was 35 MPa. Since the polycrystalline silicon produced with a water-cooled crucible had many cracks, it needed to find out portions not having cracks for the cutting out of a block and it took time. In addition, it was revealed that even if cracks were not visually observed, the polycrystalline silicon was brittle. Thus, in the case of pouring into a conventional water-cooled crucible, sufficient strength could not be obtained.

Example 4

Silicon melt produced by electron beam melting as in Example 3 was poured into a copper crucible maintained at 200° C. by circulating silicon oil to be solidified into a polycrystalline silicon ingot. The ingot was cut into a diameter of 450 mm by external cylindrical grinding and into a thickness of about 10 mm by diamond saw processing and was finished to a predetermined shape by, for example, periphery grinding and facing work, followed by bonding to a backing plate to produce a silicon target having a diameter of 440 mm.

The silicon target was subject to a 24-hour continuous sputtering test. In the silicon target of this Example, occurrence of arcing, i.e., sudden disorder of voltage during sputtering, was twice, low frequency.

Example 5

A silicon target produced under the same conditions as in Example 4 was subject to sputtering on 20 pieces of 8-inch wafers, and the resulting thin films were evaluated for particles. The number of particles having a diameter of 0.2 μm or more was 3 to 20, which was considerably small compared to the result in Comparative Example 3 shown below.

Comparative Example 2

A silicon ingot was produced by unidirectional solidification of silicon that was subject to melting with a resistance heater, which is a general procedure for silicon used for solar cells.

Subsequently, a 24-hour continuous sputtering test was performed. In the target produced from the silicon ingot of this Comparative Example, stable glow discharge suddenly disordered, and arcing, i.e., a decrease in voltage, occurred 35 times.

In addition, petaloid silicon carbide grains as shown in FIG. 2 were generated, and the presence of acicular or annular silicon nitride ($Si_3N_4$) grains was observed. The average amount of nitride or carbide grains having a size of 100 μm or more for samples of 100×100 mm was 20.

Comparative Example 3

A silicon target produced under the same conditions as in Comparative Example 2 was subject to sputtering on 20 pieces of 8-inch wafers, and the resulting thin films were evaluated for particles. The number of particles having a diameter of 0.2 μm or more was considerably large, 70 to 300.

Results of Examples and Comparative Examples

As described above, a polycrystalline silicon sputtering target having high quality can be produced by melting silicon as a raw material with an electron beam, pouring the molten silicon into a crucible, which is a copper or copper alloy crucible or a molybdenum crucible, heated at 90° C. or more to produce a silicon ingot, and machining the ingot into a target. The polycrystalline silicon sputtering target is free from precipitate (foreign substances).

There is a method using an silicon ingot prepared by transferring the molten silicon in a quartz crucible into a silica crucible, which does not have silicon nitride coating and is being heated at 300° C. or more, and after solidification, removing the crucible by grinding the crucible from the outer side of the crucible so as not to deliver shocks to the interface between the silica crucible and the silicon, or cutting the ingot, together with the crucible, at the silicon side by 20 mm or more from the interface with a band saw. According to this method, a polycrystalline silicon sputtering target having quality equivalent to that of the present invention can also be produced, but the manufacturing cost for this method is high.

A polycrystalline silicon sputtering target of the present invention that is produced by a melting method can have high quality achieved by reducing the presence of silicon nitride and silicon carbide, and enables to reduce occurrence of arcing and particles during sputtering and to form a silicon film with good quality. In addition, there is an excellent effect of preparing a polycrystalline silicon sputtering target having a high bending strength by devising the production process. The resulting target is particularly useful for producing, for example, electronic components of LSI which is progressing in miniaturization and improvement of the precision.

The invention claimed is:

1. A polycrystalline silicon sputtering target produced by a melting method, wherein an average amount of nitride or carbide grains having a size of 100 μm or more for samples of 100×100 mm taken from an arbitrary plane of the polycrystalline silicon sputtering target is less than three, and the polycrystalline silicon sputtering target has a bending strength of 50 MPa or more and a purity, excluding gas components, of 6N or more.

2. A polycrystalline silicon sputtering target produced by a melting method, wherein an average amount of nitride or carbide grains having a size of 20 μm or more for samples of 100×100 mm taken from an arbitrary plane of the polycrystalline silicon sputtering target is less than three, and the polycrystalline silicon sputtering target has a bending strength of 50 MPa or more and a purity, excluding gas components, of 6N or more.

3. The polycrystalline silicon sputtering target according to claim 2, wherein the bending strength of the target is 100 MPa or more.

4. A method of producing a polycrystalline silicon sputtering target, comprising the steps of:
producing a silicon ingot by melting silicon as a raw material with an electron beam and pouring the molten silicon into a crucible heated at 90° C. or more; and
machining the silicon ingot into a polycrystalline silicon sputtering target;
wherein an average amount of nitride or carbide grains having a size of 100 μm or more for samples of 100×100 mm taken from an arbitrary plane of the polycrystalline silicon sputtering target is less than three, and the polycrystalline silicon sputtering target has a bending strength of 50 MPa or more and a purity, excluding gas components, of 6N or more.

5. The method of producing a polycrystalline silicon sputtering target according to claim 4, wherein the crucible used during said producing step is a copper or copper alloy crucible or a molybdenum crucible.

6. The method of producing a silicon target according to claim 5, wherein a medium used for heating the crucible is water, oil, indium, or tin.

7. The method of producing a polycrystalline silicon sputtering target according to claim 6, wherein the target has a bending strength of 100 MPa or more.

8. The method of producing a silicon target according to claim 4, wherein a medium used for heating the crucible is water, oil, indium, or tin.

9. A method of producing a polycrystalline silicon sputtering target, comprising the steps of:
producing a silicon ingot by melting silicon as a raw material with an electron beam and pouring the molten silicon into a crucible heated at 90° C. or more; and
machining the silicon ingot into a polycrystalline silicon sputtering target;

wherein an average amount of nitride or carbide grains having a size of 20 μm or more for samples of 100×100 mm taken from an arbitrary plane of the polycrystalline silicon sputtering target is less than three, and the polycrystalline silicon sputtering target has a bending strength of 50 MPa or more and a purity, excluding gas components, of 6N or more.

10. The method of producing a polycrystalline silicon sputtering target according to claim 4, wherein the target has a bending strength of 100 MPa or more.

11. The polycrystalline silicon sputtering target according to claim 1, wherein the bending strength of the target is 100 MPa or more.

* * * * *